United States Patent [19]
Irikawa et al.

[11] Patent Number: 5,383,213
[45] Date of Patent: Jan. 17, 1995

[54] SEMICONDUCTOR DEVICE WITH CURRENT CONFINEMENT STRUCTURE

[75] Inventors: Michinori Irikawa, Yokohama; Masayuki Iwase; Kenichi Iga, both of Tokyo, all of Japan

[73] Assignee: The Furukawa Electric Co., Ltd., Tokyo, Japan

[21] Appl. No.: 57,758

[22] Filed: May 7, 1993

[30] Foreign Application Priority Data

May 8, 1992 [JP] Japan .................. 4-143419

[51] Int. Cl.$^6$ ................................. H01S 3/19
[52] U.S. Cl. ........................... 372/46; 372/45
[58] Field of Search ..................... 372/45, 46

[56] References Cited

U.S. PATENT DOCUMENTS 5,214,662  5/2593  Irikawa et al. .................... 372/46
5,253,265  10/1993  Seko et al. ....................... 372/46

OTHER PUBLICATIONS

IEEE Journal of Quantum Electronics, vol. 25, No. 6, Jun. 1989, pp. 1369–1375.
Electronics Letters, vol. 27, No. 1, Jan. 1991, pp. 12–13.
Appl. Phys. Lett. 55 (18), Oct. 30, 1989, pp. 1877–1878.
Jpn. J. Appl. Phys., vol. 31 (1992), pp. L1351–L1354, Part 2, No. 9B.
Electronics Letters, vol. 22, No. 19, Sep. 11, 1986, pp. 1008–1009.
IEEE Journal of Quantum Electronics, vol. 26, No. 11, Nov. 1990, pp. 2025–2035.

*Primary Examiner*—Georgia Y. Epps
*Attorney, Agent, or Firm*—Jacobson, Price, Holman & Stern

[57] ABSTRACT

There is provided a semiconductor device comprising a current confinement structure capable of reducing leakage currents. The semiconductor device comprising a current confinement structure and a multiquantum barrier structure 10 disposed in said current confinement structure and having an effect of reflecting incident carriers as waves in phase conditions capable of allowing mutual enhancement of the incident and reflected waves.

4 Claims, 3 Drawing Sheets

SEMICONDUCTOR DEVICE WITH CURRENT CONFINEMENT STRUCTURE

BACKGROUND OF THE INVENTION

1. Field of the Invention

This invention relates to a semiconductor device with current confinement structure, and more particularly, it relates to an improvement of the current confining capability of a semiconductor laser device.

2. Prior Art

A buried hetero (BH) structure plays a vital role in stabilizing the transverse mode of a long wavelength semiconductor laser device to be used for optical communications.

As illustrated in FIG. 2 of the accompanying drawings, a known semiconductor laser device having a BH structure on an n-InP substrate 1 typically comprises an n-InP clad layer 2, a GaInAsP ($\lambda g = 1.3$ $\mu$m) active layer 3, a p-InP clad layer 4 and a cap layer 5 as well as a p-InP layer 6 and an n-InP layer 7 for forming current blocking layers and an an n-electrode 8 and a p-electrode 9.

It is a well-known fact that, when embedded pn junctions are used in the current blocking layers of a semiconductor laser device of the above described type, some leakage current flows through such current blocking layers. Attempts and proposals for elimination of this problem are reported in Papers Nos. 1 and 2 listed below.

The Paper No. 2, for instance, describes the result of simulation, showing how the current confinement characteristics of such a device are improved when a strained superlattice of AlInAs/InP is used for part of the current blocking layer.

Paper No. 1: T. Ohtoshi et al., IEEE J. Quantum Electron., QE-25, 1369 (1989)

Paper No. 2: T. Ohtoshi et al., Electron. Lett. Vol. 27, 12 (1989)

So far, however, problems still remain, if pn junctions are used for embedded current blocking layers of such a device. Some of the problems will be briefly discussed below.

Firstly, the threshold current of a long wavelength semiconductor laser device increases in a high-temperature region, because of temperature dependency of the device.

As described in Paper No. 3 listed below, one of the dominant mechanisms of such a degradation in the temperature characteristics of a long-wavelength region a semiconductor laser is attributed to overflowing hot electrons due to Auger effect.

Paper No. 3: G. P. Agrawal et al., Long Wavelength Semiconductor Lasers pp. 94–113, pp. 129–141 (Van Nostrand Reinhold Company, N.Y.)

Therefore, the problem here lies in the leakage current due to hot electrons overflowing from the active layer to the current blocking layer of the device.

FIG. 3 of the accompanying drawings illustrates the relationship between the energy level of such overflowing hot electrons and the barrier height of a strained superlattice as described in the Paper No. 2 as listed above.

If the strained superlattice barrier is made of $Al_xIn_{1-x}As$, the barrier height or the discontinuity of the conduction band edge reaches its maximum at $x=0.62$, providing a barrier height of about 510 meV against InP as described in both the Paper No. 2 listed above and Paper No. 4 listed below.

Paper No. 4: F. L. Schuermeyer et al., Appl. Phys. Lett. 55, 1877 (1989)

On the other hand, since the energy of a hot electron in a semiconductor laser device having a wave length of 1.3 $\mu$m is 1.05 eV at its maximum from the conduction edge of the active layer, the overflow of hot electrons having an energy level of greater than 760 meV from the Fermi level Efn in FIG. 3 cannot be suppressed by such a barrier.

Secondly, a pnpn thyristor accompanies a parasitic element as illustrated in FIG. 2 and a amplified large anode current flows as a leakage current (B—B') when a small current (A—A') flows as a gate current. These phenomena were discussed in Japanese Patent Laid-open Publication No. Hei 5- 13882 and U.S. patent application Ser. No. 07/791,767, allowed on Dec. 15, 1992, now U.S. Pat. No. 5,214,662.

It is, therefore, an object of the present invention to provide a semiconductor device comprising current blocking layers having structural features that can effectively suppress overflows of hot electrons that may take place from the active layer to the current blocking layer of the device.

It is another object of the present invention to provide a semiconductor device comprising current blocking layers having structural features that can effectively reduce the current amplification factor of the transistor constituting a pnpn parasitic thyristor in the device as well as the flow rate of the anode current running through the thyristor.

SUMMARY OF THE INVENTION

According to the invention, the above objects and other objects of the invention are achieved by providing a current confinement type semiconductor device comprising a current confinement structure and a multiquantum barrier structure disposed in said current confinement structure, said multiquantum barrier structure having an effect of reflecting incident carriers as waves in phase conditions capable of allowing mutual enhancement of the incident and reflected waves so that the reflectivities of said carriers are almost one.

The multiquantum barrier structure of a semiconductor device according to the invention preferably comprises a strained superlattice layer.

The use of a multiquantum barrier (MQB) having a strained superlattice layer as a barrier for suppressing overflowing hot electrons generated by an Auger effect was disclosed by inventors of the present invention in Japanese Patent Laid-open Publication No. Hei 5-7051 which corresponds to U.S. Pat. No. 5,251,224 and Paper No. 5 listed below.

Paper No. 5: M. Irikawa et al., Jpn. Appl. Phys. 31 (1992) L1351

The principle of MQB is to realize a barrier higher than any classical barriers by reflecting incident carriers as waves in a phase conditions capable of allowing mutual enhancement of the incident and reflected waves, as described in Paper No. 6 listed below.

Paper No. 6: K. Iga et al., Electron. Lett. 22, 1008 (1986)

Japanese Patent Laid-open Publication No. Hei 5-7051 which corresponds to U.S. Pat. No. 5,251,224 and the Paper No. 5 disclose that the use of an $Al_xIn_{1-x}As$ ($x=0.62$) layer having about a 1% tensile strain as an MQB barrier layer can give rise to a barrier structure capable of effectively reflecting and confining hot electrons generated in the active layer of a 1.3 μm wavelength semiconductor laser device.

The present invention consists in applying such an MQB structure to the current blocking layer of a long wavelength semiconductor laser device.

Then, in a device according to the invention, hot electrons generated in the active layer and apt to overflow to the current blocking layer due to an Auger effect can be effectively confined within the active layer of the device by a remarkable height of the effective barrier that the MQB structure can provide against electrons. At the same time, the current gain of any parasitic npn transistor generated in the pnpn thyristor of the device and hence the anode current of the thyristor are significantly reduced.

Now, the present invention will be described in greater detail by referring to the accompanying drawings that illustrate a preferred embodiment of current confining type semiconductor device of the invention.

DETAILED DESCRIPTION OF THE INVENTION

Figure 1A:
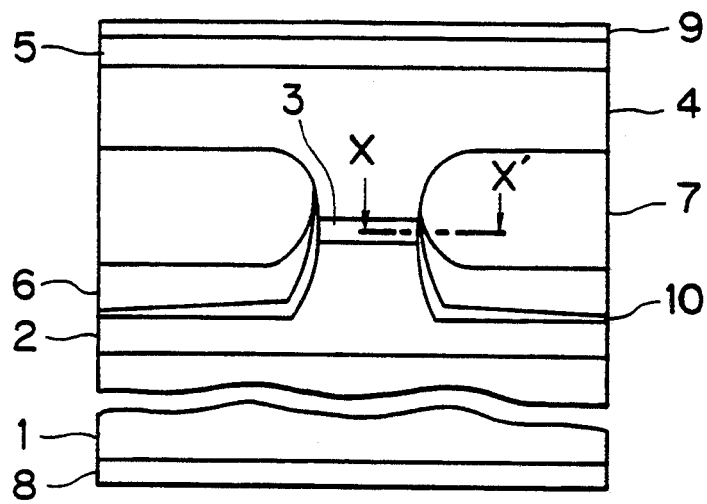
FIG. 1(a) is a schematic cross sectional view of a preferred embodiment of semiconductor laser device according to the invention.

FIG. 1(a) illustrates a preferred embodiment of the current confining type semiconductor laser diode with current confinement structure type of the invention comprising an n-InP substrate 1, an n-InP clad layer 2, a GaInAsP ($\lambda g=1.3$ μm) active layer 3, a p-InP clad layer 4, a cap layer 5, a p-InP layer 6 and an n-InP layer 7 both for forming a current blocking layers, an n-electrode 8 and a p-electrode 9.

The semiconductor laser device as illustrated in FIG. 1(a) is characterized by a multiquantum barrier layer 10 between the n-InP clad layer 2 and the p-InP layer 6.

Figure 1B:
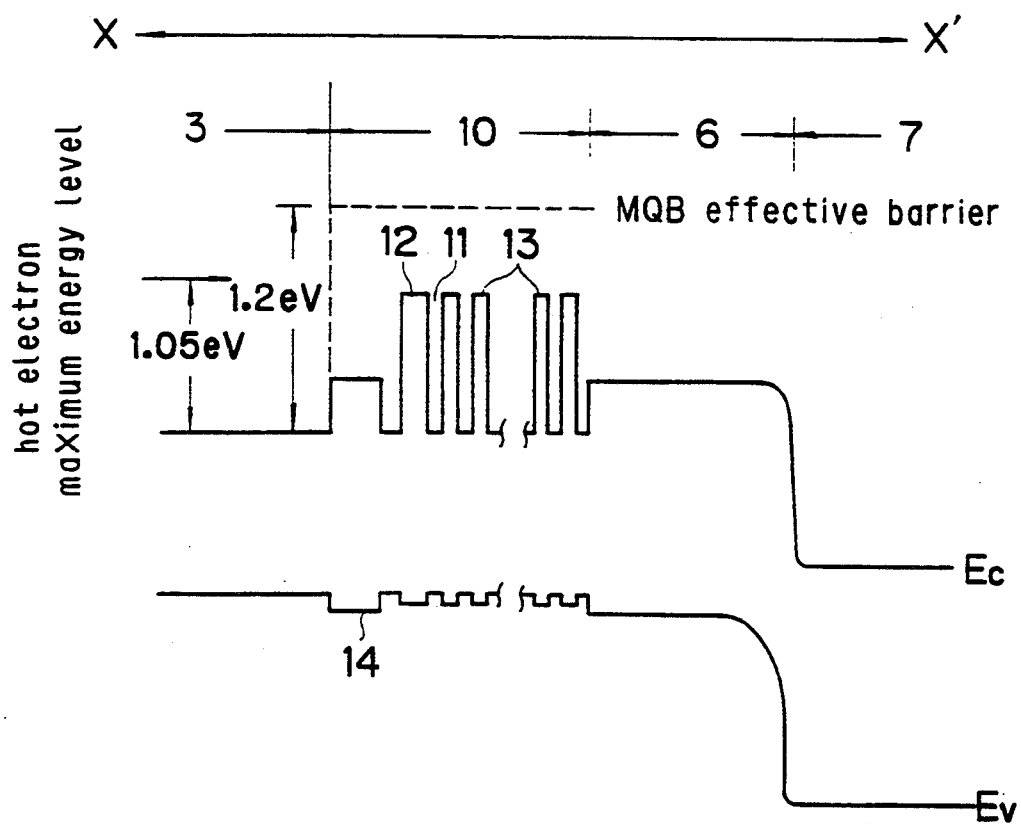
FIG. 1(b) is a schematic diagram, showing some of the structural features of an energy band existing in a major part of the device of FIG. 1(a).

FIG. 1(b) schematically illustrates some of the structural features of an energy band that takes place along a path X—X' from the active layer 3 to the n-InP layer 7 by way of the multiquantum barrier layer 10 and the n-InP layer 6 along with the effective barrier height of the MQB and the highest energy level of hot electrons.

As is clearly shown in FIG. 1(b), the multiquantum barrier layer 10 comprises a (1) 60-ML thick InP layer 14, eight (8) 6-ML thick GaInAs well layer 11, a (1) 15-ML thick p-$Al_xIn_{1-x}As$ barrier layer 12 and six (6) 4 ML thick p-$Al_xIn_{1-x}As$ barrier layer 13. The p-type modulation doping to the MQB region is employed, i.e. $3 \times 10^{17} cm^{-3}$ to the wells and $3 \times 10^{14} cm^{-3}$ to the barriers.

The values of energy levels in the following description are from the conduction band edge of the GaAsInP active layer as a reference level.

If x=0.48 or x=0.62 is assumed for the material of the MQB (hereinafter referred to as MQB1 and MQB2 respectively), their respective characteristic properties will be as follows.

The MQB1 is lattice-matched to InP and the barriers 12 and 13 have energy level $E_B$ of 420 meV.

The MQB2 has a 1% in-plane tensile strain barriers and the energy level $E_B$ of barriers 12 and 13 is 690 meV.

According to a calculation conducted by the inventor of the present invention by using transfer matrix method (TMM) described in Paper No. 7 as listed below, the effective barrier height of the MQB2 is 1.2 eV.

Paper No. 7: B. Jonsson et al., IEEE J. Quantum Electron., QE-26, 2025 (1990)

From the fact that the multiquantum barrier layer 10 provides an effective barrier height of 1.2 eV as illustrated in FIG. 1(b), it will be understood that hot electrons (having a maximum energy level of about 1.05 eV) generated by Auger effect in the active layer 3 inject into MQB region 10 are effectively confined within the active layer 3.

While the effect of the embodiment for confining hot electrons is described above, it will be appreciated that the embodiment is also effective to hot holes due to Auger effect.

Figure 2:
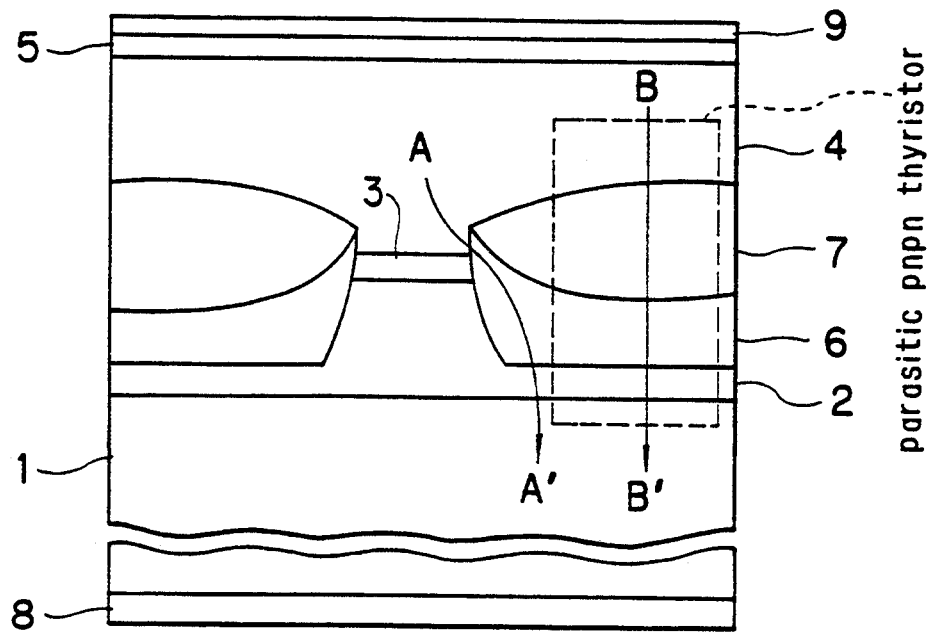
FIG. 2 is a schematic cross sectional view of a conventional BH laser.
Figure 3:
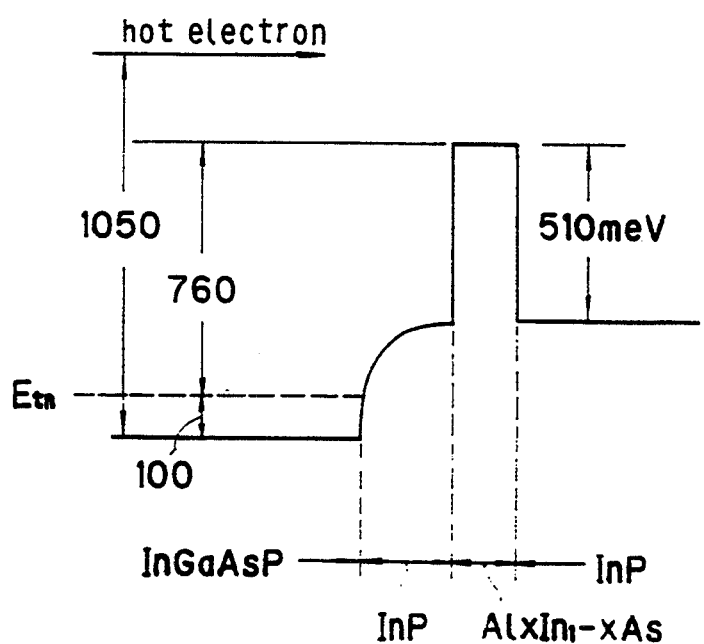
FIG. 3 is a schematic diagram, showing the relationship between the energy level of hot electrons and the barrier height of a strained superlattice for $Al_{0.62}In_{0.38}As/InP$.

On the other hand, the increased effective barrier height that the multiquantum barrier layer 10 can provide against electrons reduces the current gain of the parasitic npn transistor in the npnp thrysitor illustrated in FIG. 2 and consequently has an effect of reducing the anode current of the thyristor. These phenomena will now be described.

The equivalent circuit of pnpn thyristor can be illustrated by diagram of FIG. 4, where anode current $I_A$ is expressed by equation (1) below.

$$I_A = (I_o + \alpha_2 M_n I_g)/[1-(\alpha_1 M_p + \alpha_2 M_n)] \quad (1)$$

In equation (1), $\alpha_1$ and $\alpha_2$ are the common base current gains of the transistors 1 and 2, respectively (where $\alpha_1, \alpha_2 < 1$) and $M_n$ and $M_p$ are the gains at junction $J_2$ relative to electrons and holes, respectively.

Therefore, it will be appreciated that the smaller $\alpha_1$ and $\alpha_2$ are, the smaller $I_A$ will be realized for a given gate current $I_g$.

Figure 4:
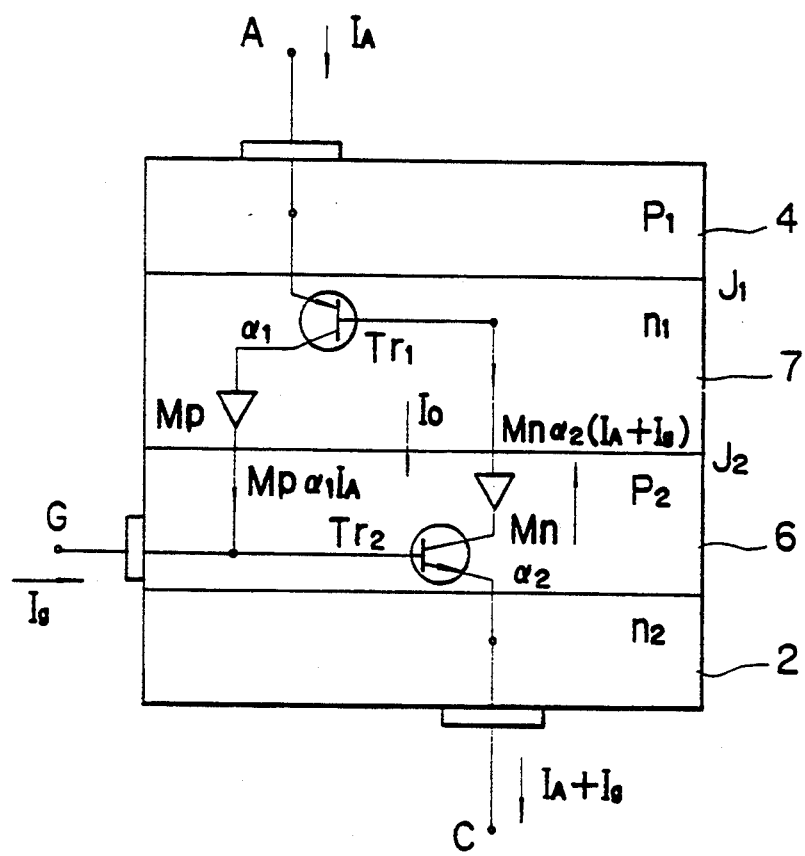
FIG. 4 is a schematic equivalent circuit diagram for a pnpn thyristor.

It will also be appreciated that the base and the emitter of the transistor 2 in FIG. 4 correspond to the p-InP layer 6 and the n-InP clad layer 2 in FIG. 1(a), respectively, in FIG. 1(a).

In general terms and referring to equations (2) through (4) below, the following statement will hold true for the common base current gain $\alpha_2$ of an npn transistor.

$$\alpha_2 = \gamma kT \quad (2)$$

$$\alpha_T = [\cosh(W_B/L_B)]^{-1} \quad (3)$$

$$\gamma = \text{emitter injection efficiency} \quad (4)$$

$$= \frac{\text{electron current injected from emitter to base}}{\text{overall emitter current}}$$

where $W_B$ is the base width and $L_B$ is the minority carrier diffusion length within the base.

In equation (4), $\gamma$ can be reduced as the current of electrons injected from the emitter to the base is sufficiently blocked by the barrier of the multiquantum barrier layer 10.

Then, from equation (2), $\alpha_2$ will also be reduced to reduce the anode current $I_A$.

It will be understood from the following description on the applicability of the invention that the present invention is not limited to the above embodiment.

Firstly, the technology involved in the present invention can be applied not only to current confinement structures having a pn junction but also to current confinement structures having a semi-insulating semiconductor layer made of a material such as Fe-doped InP.

Secondly, the technology of the present invention can also be applied to devices made of a material other than InP.

Finally, the technology of the present invention can also be applied to devices other than semiconductor laser devices such as semiconductor optical amplifiers and semiconductor optical switches that require a current confinement structure.

A semiconductor device according to the invention can be prepared by means of an epitaxial growth technique such as MOCVD and MOMBE that can effectively control the deposition of ultrathin films. A device manufacturing method utilizing the technique of atomic layer epitaxy (ALE) will prove to be very effective as it can uniformly deposit a thin film on either side of the lateral walls of a device of the type under consideration.

As is clear from the above description, since a semiconductor device with current confinement structure according to the invention comprises a current confinement structure and a multiquantum barrier structure disposed in said current confinement structure and having an effect of reflecting incident carriers as waves in with a phase conditions capable of allowing mutual enhancement of the incident and reflected waves, it has a high effective barrier and can effectively suppress overflows of hot electrons that may take place from the active layer to the current confinement structure of the device and, at the same time, reduce the current gains of the transistor constituting a pnpn parasitic thyristor in the device as well as the flow rate of the anode current of the thyristor.

What is claimed is:

1. A semiconductor device consisting of a substrate, active region and semiconductor current blocking layers to confine current to said active region and electrodes to inject current or to apply voltage, wherein said current blocking layers include a multiquantum barrier structure.

2. A semiconductor device claimed in claim 1, wherein said current blocking structure constitutes BH structure and includes pn junction, and wherein said multiquantum barrier structure consists of superlattice of GaInAsP or AlGaInAs materials.

3. A semiconductor device claimed in claim 1, wherein said current blocking structure constitutes BH structure and includes semi-insulating layer, and wherein said multiquantum barrier structure consists of superlattice of GaInAsP or AlGaInAs materials.

4. A fabrication method of the device claimed in claim 1, comprising utilizing atomic multiquantum barrier layer epitaxy method to form NQB structure at the side wall of said active region.

* * * * *